US008546839B2

(12) United States Patent
Wei et al.

(10) Patent No.: US 8,546,839 B2
(45) Date of Patent: Oct. 1, 2013

(54) LIGHT EMITTING DIODE

(75) Inventors: Yang Wei, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 54 days.

(21) Appl. No.: 13/288,238

(22) Filed: Nov. 3, 2011

(65) Prior Publication Data
US 2012/0273828 A1   Nov. 1, 2012

(30) Foreign Application Priority Data

Apr. 29, 2011   (CN) .......................... 2011 1 0110779

(51) Int. Cl.
*H01L 33/00* (2010.01)
*H01L 27/15* (2006.01)
*H01L 21/00* (2006.01)

(52) U.S. Cl.
USPC ................... 257/99; 257/79; 257/86; 257/94; 257/103; 257/E33.001; 257/E33.01; 257/E33.013; 257/E33.055; 438/22; 438/23; 438/27; 438/29

(58) Field of Classification Search
None
See application file for complete search history.

(56) References Cited

U.S. PATENT DOCUMENTS

2010/0221852 A1* 9/2010 Li et al. ........................... 438/22
2011/0220946 A1* 9/2011 Na et al. .......................... 257/98
2012/0056237 A1* 3/2012 Choi et al. ..................... 257/103

* cited by examiner

*Primary Examiner* — Fernando L Toledo
*Assistant Examiner* — Harpreet Singh
(74) *Attorney, Agent, or Firm* — Altis & Wispro Law Group, Inc.

(57) ABSTRACT

A light emitting diode includes a substrate, a first semiconductor layer, an active layer and a second semiconductor layer. The first semiconductor layer, the active layer and the second semiconductor layer are stacked on one side of the substrate in that order. The first semiconductor layer is oriented to the substrate. A number of channels are defined between the first semiconductor layer and the substrate.

19 Claims, 10 Drawing Sheets

LIGHT EMITTING DIODE

CROSS-REFERENCE TO RELATED APPLICATIONS

This application claims all benefits accruing under 35 U.S.C. §119 from China Patent Application No. 201110110779.9, filed on Apr. 29, 2011, in the China Intellectual Property Office, the contents of which are hereby incorporated by reference. This application is related to commonly-assigned applications entitled "LIGHT EMITTING DIODE", filed Nov. 3, 2011 Ser. No. 13/288,174; "LIGHT EMITTING DIODE", filed Nov. 3, 2011 Ser. No. 13/288,180; "METHOD FOR MAKING LIGHT EMITTING DIODE", filed Nov. 3, 2011 Ser. No. 13/288,183; "LIGHT EMITTING DIODE", filed Nov. 3, 2011 Ser. No. 13/288,187; "METHOD FOR MAKING LIGHT EMITTING DIODE", filed Nov. 3, 2011 Ser. No. 13/288,192; "LIGHT EMITTING DIODE", filed Nov. 3, 2011 Ser. No. 13/288,327; "LIGHT EMITTING DIODE", filed Nov. 3, 2011 Ser. No. 13/288,203; "METHOD FOR MAKING LIGHT EMITTING DIODE", Nov. 3, 2011 Ser. No. 13/288,213; "LIGHT EMITTING DIODE", filed Nov. 3, 2011 Ser. No. 13/288,222; "LIGHT EMITTING DIODE", filed Nov. 3, 2011 Ser. No. 13/288,234; "METHOD FOR MAKING LIGHT EMITTING DIODE", filed Nov. 3, 2011 Ser. No. 13/288,246. The disclosures of the above-identified applications are incorporated herein by reference.

BACKGROUND

1. Technical Field

The present disclosure relates to a light emitting diode (LED) and a method for making the same.

2. Description of Related Art

In recent years, highly efficient LEDs made with GaN-based semiconductors have been widely applied in different technologies, for example in display devices, large electronic billboards, street lights, car lights, and other illumination applications. LEDs are environmentally friendly, and have long working life, and low power consumption.

A conventional LED commonly includes an N-type semiconductor layer, a P-type semiconductor layer, an active layer, an N-type electrode and a P-type electrode. The active layer is located between the N-type semiconductor layer and the P-type semiconductor layer. The P-type electrode is located on the P-type semiconductor layer. The N-type electrode is located on the N-type semiconductor layer. Typically, the P-type electrode is transparent. In operation, a positive voltage and a negative voltage are applied respectively to the P-type semiconductor layer and the N-type semiconductor layer. Thus, holes in the P-type semiconductor layer and electrons in the N-type semiconductor layer can enter the active layer and combine with each other to emit visible light.

However, extraction efficiency of LEDs is low because typical semiconductor materials have a higher refractive index than that of air. Large-angle light is light traveling at an angle defined between the light and a medium boundary. If the angle is larger than a particular critical angle, the light will be internally reflected. Large-angle light emitted from the active layer may be internally reflected in LEDs, so that a large portion of the light emitted from the active layer will remain in the LEDs, thereby degrading the extraction efficiency.

What is needed, therefore, is an LED which can overcome the above-described shortcomings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
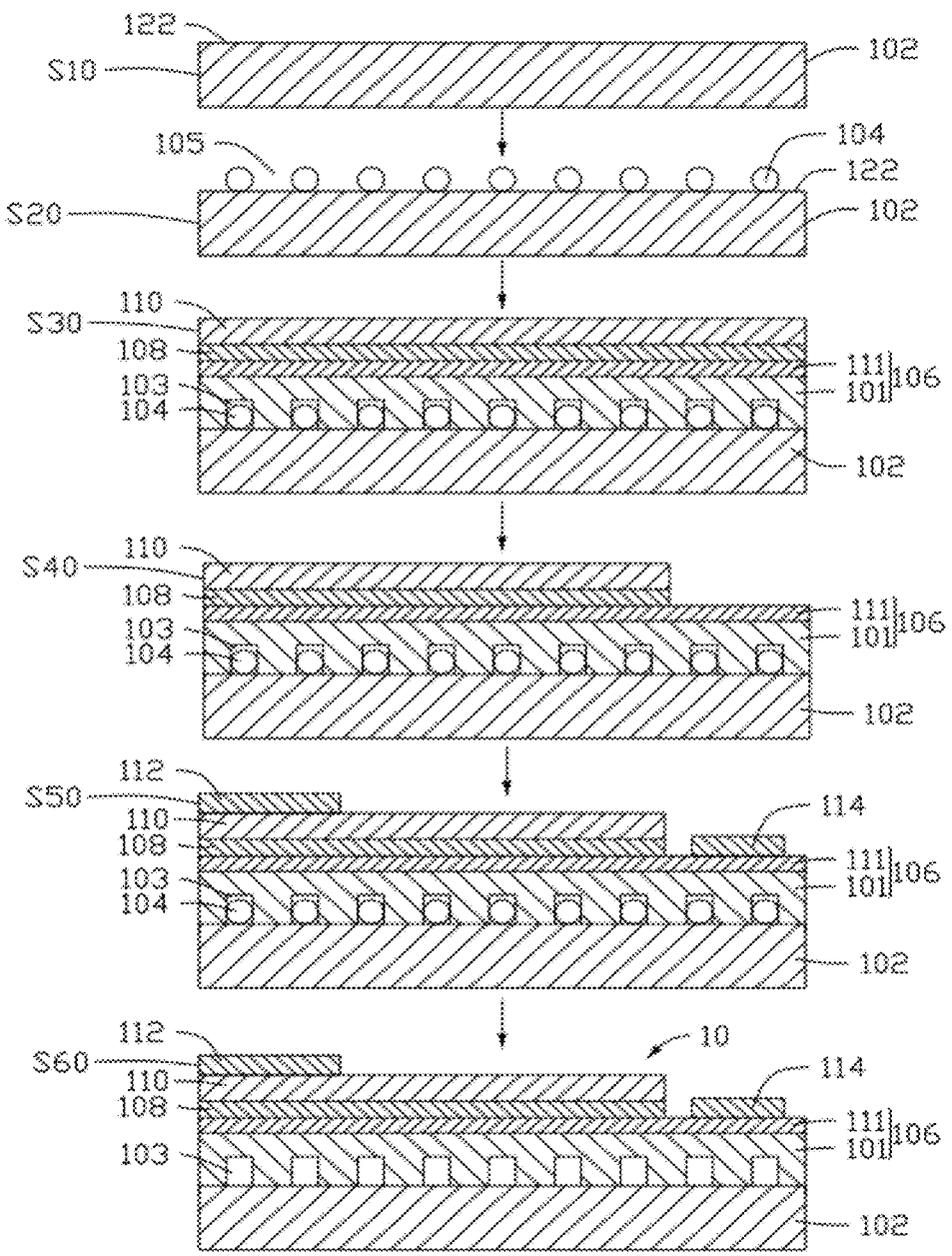
FIG. 1 is a flowchart of one embodiment of a method for making an LED.

Referring to FIG. 1, a method for making an LED of one embodiment includes the following steps:

S10, providing a substrate 102 having an epitaxial growth surface 122;

S20, placing a carbon nanotube layer 104 on the epitaxial growth surface 122;

S30, growing a first semiconductor layer 106, an active layer 108, and a second semiconductor layer 110 on the epitaxial growth surface 122;

S40, exposing a portion of the first semiconductor layer 106 by etching a portion of the second semiconductor layer 110 and the active layer 108;

S50, preparing a first electrode 114 on the first semiconductor layer 106, and preparing a second electrode 112 on the second semiconductor layer 110; and S60, removing the carbon nanotube layer 104.

In step S10, the epitaxial growth surface 122 can be used to grow the first semiconductor layer 106. The epitaxial growth surface 122 is a clean and smooth surface. The substrate 102 can be made of transparent material. The substrate 102 is used to support the first semiconductor layer 106. The substrate 102 can be a single-layer structure or a multi-layered structure. If the substrate 102 is a single-layer structure, the substrate 102 can be a single crystal structure having a crystal face. The crystal face can be used as the epitaxial growth surface 122. If the substrate 102 is the signal-crystal structure, the material of the substrate 102 can be made of SOI (silicon on insulator), LiGaO$_2$, LiAlO$_2$, Al$_2$O$_3$, Si, GaAs, GaN, GaSb, InN, InP, InAs, InSb, AlP, AlAs, AlSb, AlN, SiC, SiGe, GaMnAs, GaAlAs, GaInAs, GaAlN, GaInN, AlInN, GaAsP, InGaN, AlGaInN, AlGaInP, Aperture:Zn or Aperture:N. If the substrate 102 is a multi-layer structure, the substrate 102 should include at least one layer of the above-described single crystal structure having a crystal face. The size, thickness and shape of the substrate 102 can be selected according to need. In one embodiment, the substrate 102 is made of sapphire.

In step S20, the carbon nanotube layer 104 includes a number of carbon nanotubes. A thickness of the carbon nanotube layer 104 can be in a range from 1 nm to 100 μm, for example about, 1 nm, 10 nm, 200 nm, 1 μm or 10 μm. In one embodiment, the thickness of the carbon nanotube layer 104 is about 100 nm. The length and diameter of the carbon nanotubes in the carbon nanotube layer 104 are selected according to need. The carbon nanotubes in the carbon nanotube layer 104 can be single-walled, double-walled, multi-walled carbon nanotubes, or combinations thereof.

The carbon nanotube layer 104 forms a pattern so part of the epitaxial growth surface 122 can be exposed from the patterned carbon nanotube layer 104 after the carbon nanotube layer 104 is placed on the epitaxial growth surface 122. Thus, the first semiconductor layer 106 can grow from the exposed epitaxial growth surface 122.

The patterned carbon nanotube layer 104 defines a number of apertures 105. The apertures 105 are dispersed uniformly. The apertures 105 extend through the carbon nanotube layer 104 along a thickness direction of the carbon nanotube layer 104. Therefore, the carbon nanotube layer 104 is a graphical structure. The carbon nanotube layer 104 covers the epitaxial growth surface 122 of the substrate 102. A portion of the epitaxial growth surface 122 is then exposed from the apertures 105 of the carbon nanotube layer 104, and the first semiconductor layer 106 grows from the apertures 105 of the carbon nanotube layer 104. The aperture 105 can be a hole defined by several adjacent carbon nanotubes or a gap defined by two substantially parallel carbon nanotubes and extending along axial directions of the carbon nanotubes. The size of the apertures 105 can be the diameter of the hole or width of the gap, and can be in a range from about 10 nanometers to about 500 micrometers. The hole-shaped apertures 105 and the gap-shaped apertures 105 can exist in the patterned carbon nanotube layer 104 at the same time. The sizes of the apertures 105 within can be different. The sizes of the apertures 105 can be, for example about, 1 nanometer, 10 nanometers, 50 nanometers, 80 nanometers, 100 nanometers, 120 nanometers, or 500 nanometers. The smaller the sizes of the apertures 105, the less dislocation defects will occur during the process of growing the first semiconductor layer 106. In one embodiment, the sizes of the apertures 105 are in a range from about 10 nanometers to about 10 micrometers. The duty factor of the carbon nanotube layer 104 is an area ratio between the sheltered epitaxial growth surface 122 and the exposed epitaxial growth surface 122. The dutyfactor of the carbon nanotube layer 104 can be in a range from about 1:100 to about 100:1, such as about, 1:10, 1:2, 1:4, 4:1, 2:1 or 10:1. In one embodiment, the dutyfactor of the carbon nanotube layer 104 is in a range from about 1:4 to about 4:1.

Figure 2:
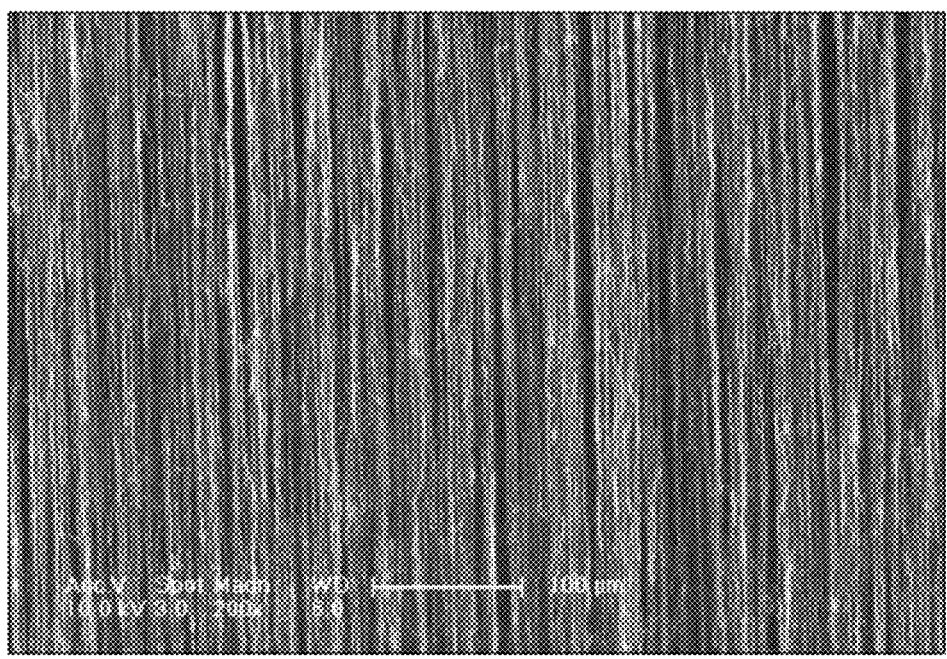
FIG. 2 is a Scanning Electron Microscope (SEM) image of a drawn carbon nanotube film used in the method of FIG. 1.
Figure 4:
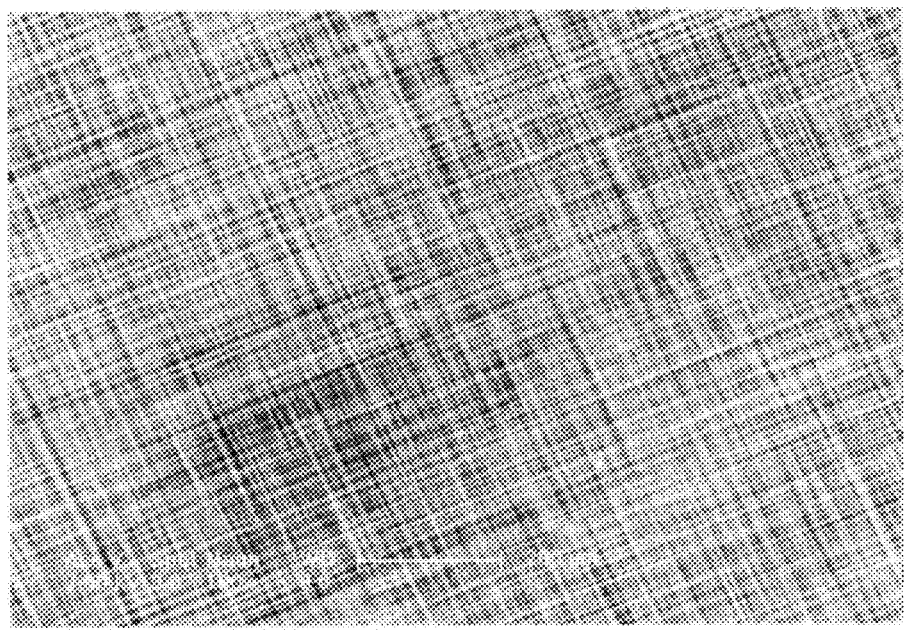
FIG. 4 is an SEM image of cross-stacked carbon nanotube films used in the method of FIG. 1.

In one embodiment, the carbon nanotubes in the carbon nanotube layer 104 are arranged to extend along the direction substantially parallel to the surface of the carbon nanotube layer 104 to obtain a pattern and greater light transmission. After being placed on the epitaxial growth surface 122, the carbon nanotubes in the carbon nanotube layer 104 are arranged to extend along the direction substantially parallel to the epitaxial growth surface 122. Referring to FIG. 2, all the carbon nanotubes in the carbon nanotube layer 104 are arranged to substantially extend along the same direction. Referring to FIG. 4, part of the carbon nanotubes in the carbon nanotube layer 104 are arranged to extend along a first direction. The other part of the carbon nanotubes in the carbon nanotube layer 104 are arranged to extend substantially along a second direction, perpendicular to the second direction. Also the carbon nanotubes in the ordered carbon nanotube structure can be arranged to extend along the crystallographic orientation of the substrate 102 or along a direction, which forms an angle with the crystallographic orientation of the substrate 102.

The carbon nanotube layer 104 can be formed on the epitaxial growth surface 122 by chemical vapor deposition (CVD), transfer printing a preformed carbon nanotube film, or filtering and depositing a carbon nanotube suspension. In one embodiment, the carbon nanotube layer 104 is a free-standing structure and can be drawn from a carbon nanotube array. The term "free-standing structure" means that the carbon nanotube layer 104 can sustain the weight of itself if it is hoisted by a portion thereof without any significant damage to its structural integrity. Thus, the carbon nanotube layer 104 can be suspended by two spaced supports. The free-standing carbon nanotube layer 104 can be laid on the epitaxial growth surface 122 directly and easily.

The carbon nanotube layer 104 can be a continuous structure or a discontinuous structure. The discontinuous carbon nanotube layer 104 includes a number of carbon nanotube wires substantially parallel to each other. If the carbon nanotube layer 104 has carbon nanotube wires substantially parallel to each other and a supporting force is applied to the carbon nanotube layer 104 in a direction substantially perpendicular to axial directions of the carbon nanotube wires, the parallel carbon nanotube wires can form a free-standing structure. The successive carbon nanotubes are joined end to end by van der Waals attractive force in a direction substantially parallel to an axial direction of the carbon nanotube. The carbon nanotubes are connected with each other by van der Waals attractive force in a direction substantially perpendicular to an axial direction of the carbon nanotubes.

The carbon nanotube layer 104 can be a substantially pure structure of the carbon nanotubes, with few impurities and chemical functional groups. The carbon nanotube layer 104 can be a composite including a carbon nanotube matrix and some non-carbon nanotube materials. The non-carbon nanotube materials can be graphite, graphene, silicon carbide, boron nitride, silicon nitride, silicon dioxide, diamond, amorphous carbon, metal carbides, metal oxides, or metal nitrides. The non-carbon nanotube materials can also be coated on the carbon nanotubes of the carbon nanotube layer 104 or filled in the apertures 105. In one embodiment, the non-carbon nanotube materials are coated on the carbon nanotubes of the carbon nanotube layer 104 so the carbon nanotubes can have greater diameters and the apertures 105 can have smaller sizes. The non-carbon nanotube materials can be deposited on the carbon nanotubes of the carbon nanotube layer 104 by CVD, physical vapor deposition (PVD), and sputtering.

Furthermore, the carbon nanotube layer 104 can be treated with an organic solvent after being placed on the epitaxial growth surface 122 so the carbon nanotube layer 104 can be attached on the epitaxial growth surface 122 firmly. Specifically, the organic solvent can be applied to the entire surface of the carbon nanotube layer 104 or the entire carbon nanotube layer 104 can be immerged in an organic solvent. The organic solvent can be volatile, for example ethanol, methanol, acetone, dichloroethane, chloroform, or mixtures thereof. In one embodiment, the organic solvent is ethanol.

The carbon nanotube layer 104 can include at least one carbon nanotube film, at least one carbon nanotube wire, or combination thereof. In one embodiment, the carbon nanotube layer 104 can include a single carbon nanotube film or two or more stacked carbon nanotube films. Thus, the thickness of the carbon nanotube layer 104 can be controlled by the number of the stacked carbon nanotube films. The number of the stacked carbon nanotube films can be in a range from about 2 to about 100, for example 10, 30, or 50. In one embodiment, the carbon nanotube layer 104 can include a layer of parallel and spaced carbon nanotube wires. Also, the carbon nanotube layer 104 can include a plurality of carbon nanotube wires crossed or weaved together to form a carbon nanotube net. The distance between two adjacent parallel and spaced carbon nanotube wires can be in a range from about 0.1 nm to about 200 nm. In one embodiment, the distance between two adjacent parallel and spaced carbon nanotube wires can be in a range from about 10 nm to about 100 nm. The size of the apertures 105 can be controlled by the distance between two adjacent parallel and spaced carbon nanotube wires. The length of the gap between two adjacent parallel carbon nanotube wires can be equal to the length of the carbon nanotube wire. Any carbon nanotube structure described can be used with all embodiments.

A drawn carbon nanotube film is composed of a plurality of carbon nanotubes. A large majority of the carbon nanotubes in the drawn carbon nanotube film can be oriented along a preferred orientation, meaning that a large majority of the carbon nanotubes in the drawn carbon nanotube film are arranged substantially along the same direction. An end of one carbon nanotube is joined to another end of an adjacent carbon nanotube arranged substantially along the same direction by van der Waals attractive force. The drawn carbon nanotube film is capable of forming a freestanding structure. The successive carbon nanotubes joined end to end by van der Waals attractive force realizes the freestanding structure of the drawn carbon nanotube film.

Some variations can occur in the orientation of the carbon nanotubes in the drawn carbon nanotube film. Microscopically, the carbon nanotubes oriented substantially along the same direction may not be perfectly aligned in a straight line, and some curve portions may exist. A contact between some carbon nanotubes located substantially side by side and oriented along the same direction cannot be totally excluded.

The structure of the drawn carbon nanotube film and the method for making the drawn carbon nanotube film is illustrated as follows.

Figure 3:
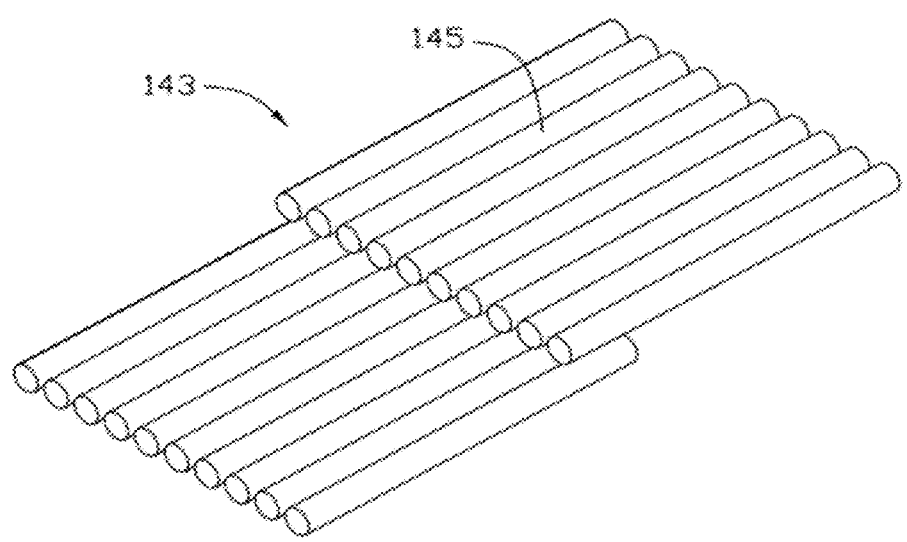
FIG. 3 is a schematic structural view of a carbon nanotube segment of the drawn carbon nanotube film of FIG. 2.

Referring to FIGS. 2 and 3, each drawn carbon nanotube film includes a plurality of successively oriented carbon nanotube segments 143 joined end-to-end by van der Waals attractive force therebetween. Each drawn carbon nanotube segment 143 includes a plurality of carbon nanotubes 145 substantially parallel to each other, and combined by van der Waals attractive force therebetween. The drawn carbon nanotube segments 143 can vary in width, thickness, uniformity, and shape. The carbon nanotubes in the drawn carbon nanotube film are also substantially oriented along a preferred orientation. A thickness of the drawn carbon nanotube film can range from about 1 nm to about 100 μm in one embodiment. The thickness of the drawn carbon nanotube film can range from about 100 nm to about 10 nm in another embodiment. A width of the drawn carbon nanotube film relates to the carbon nanotube array from which the drawn carbon nanotube film is drawn. The apertures between the carbon nanotubes in the drawn carbon nanotube film can form the apertures 105 in the carbon nanotube layer 104. The apertures between the carbon nanotubes in the drawn carbon nanotube film can be less than 10 nm. Examples of the drawn carbon nanotube film are taught by U.S. Pat. No. 7,045,108 to Jiang et al., and WO 2007015710 to Zhang et al.

Figure 6:
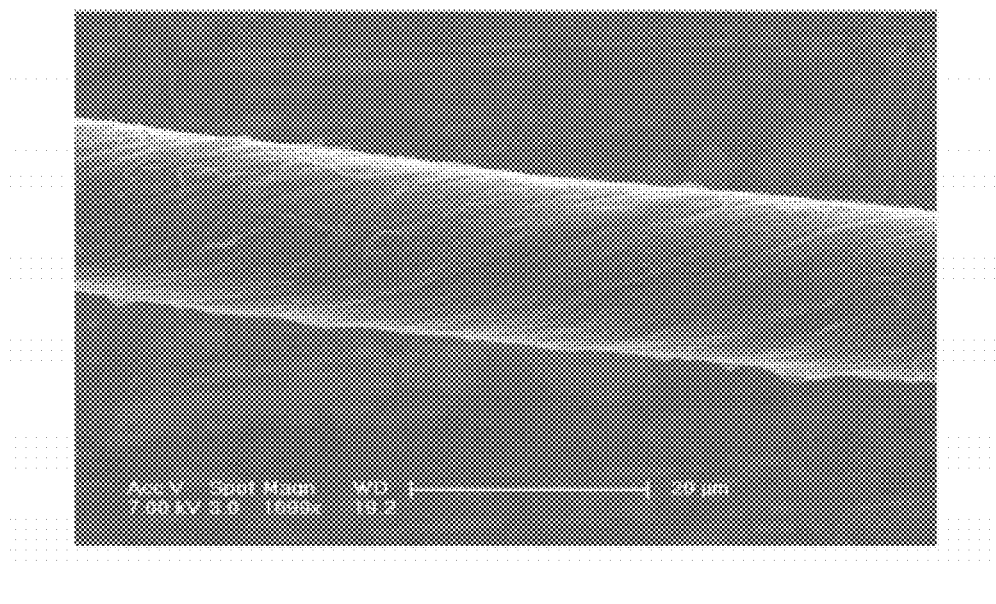
FIG. 6 is an SEM image of twisted carbon nanotube films used in the method of FIG. 1.

The carbon nanotube layer 104 includes at least two drawn carbon nanotube films stacked with each other. In other embodiments, the carbon nanotube layer 104 can include two or more coplanar carbon nanotube films, and each coplanar carbon nanotube film can include multiple layers. Additionally, if the carbon nanotubes in the carbon nanotube film are aligned along one preferred orientation (e.g., the drawn carbon nanotube film), an angle can exist between the orientation of carbon nanotubes in adjacent films, whether stacked or adjacent. Adjacent carbon nanotube films are combined by van der Waals attractive force therebetween. An angle between the aligned directions of the carbon nanotubes in the two adjacent drawn carbon nanotube films can range from about 0 degrees to about 90 degrees ($0°\leq\alpha\leq90°$). If $\alpha=0°$, the two adjacent drawn carbon nanotube films are arranged in the same direction with each other. If the angle between the aligned directions of the carbon nanotubes in adjacent stacked drawn carbon nanotube films is larger than 0 degrees, a plurality of micropores is defined by the carbon nanotube layer 104. Referring to FIG. 6, the carbon nanotube layer 104 shown with the angle between the aligned directions of the carbon nanotubes in adjacent stacked drawn carbon nanotube films is 90 degrees. The stacked drawn carbon nanotube films can improve the strength and maintain the shape of the carbon nanotube layer 104. Stacking the carbon nanotube films also increase the structural integrity of the carbon nanotube layer 104.

Furthermore, the carbon nanotube layer 104 can be heated to decrease the thickness of the carbon nanotube layer 104. If the carbon nanotube layer 104 is heated, the carbon nanotubes with larger diameters will absorb more energy and be destroyed. The carbon nanotube layer 104 can be heated locally to protect the carbon nanotube layer 104 from damage. In one embodiment, the carbon nanotube layer 104 is heated by the following steps: (1) dividing a surface of the carbon nanotube layer 104 into a number of local areas; (2) heating all of the local areas of the carbon nanotube layer 104 one by one. The carbon nanotube layer 104 can be heated by a laser or a microwave. In one embodiment, the carbon nanotube layer 104 is heated by the laser and a power density of the laser is greater than $0.1\times10^4$ W/m$^2$.

The laser can irradiate the carbon nanotube layer 104 in many ways. The direction of the laser can be substantially perpendicular to the surface of the carbon nanotube layer 104. The moving direction of the laser can be substantially parallel or perpendicular to axial directions of the carbon nanotubes in the carbon nanotube layer 104. For a laser with a stable power density and wavelength, the slower the moving speed of the laser, the more carbon nanotubes of the carbon nanotube layer 104 will be destroyed, and the thinner the carbon nanotube layer 104. However, if the speed is too slow, the carbon nanotube layer 104 will be completely destroyed. In the present embodiment, a power density of the laser is about $0.053\times10^{12}$ W/m$^2$, a diameter of the irradiating pattern of the laser is in a range from about 1 mm to about 5 mm, and a laser irradiation time is less than 1.8 seconds. In the present embodiment, the laser is a carbon dioxide laser and the power density of the laser is about 30 W, a wavelength of the laser is about 10.6 μm, a diameter of the irradiating pattern of the laser is about 3 mm, and a moving speed of the laser device is less than 10 m/s.

Figure 5:
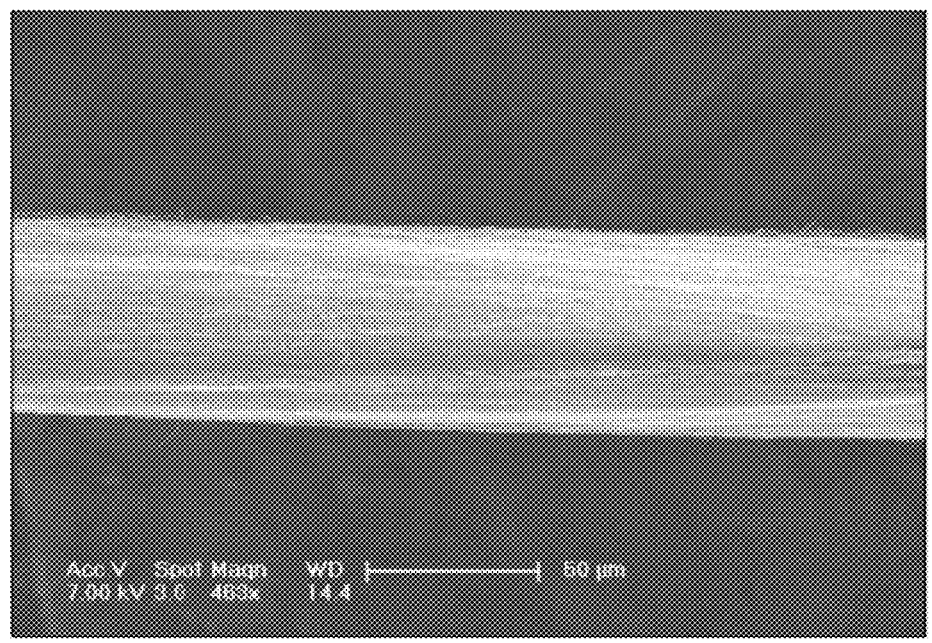
FIG. 5 is an SEM image of untwisted carbon nanotube wire used in the method of FIG. 1.

The carbon nanotube wire can be an untwisted carbon nanotube wire or a twisted carbon nanotube wire. Both the untwisted carbon nanotube wire or twisted carbon nanotube wire can be a free-standing structure. Referring to FIG. 5, the untwisted carbon nanotube wire includes a plurality of carbon nanotubes substantially oriented along a direction along the length of the untwisted carbon nanotube wire. Specifically, the untwisted carbon nanotube wire includes a plurality of successive carbon nanotube treated segments joined end to end by van der Waals attractive force therebetween. Each carbon nanotube treated segment includes a plurality of carbon nanotubes substantially parallel to each other, and combined by van der Waals attractive force therebetween. The carbon nanotube treated segments can vary in width, thickness, uniformity, and shape. The length of the untwisted carbon nanotube wire can be arbitrarily set as desired. A diameter of the untwisted carbon nanotube wire can be in a range from about 0.5 nm to about 100 nm. The untwisted carbon nanotube wire is formed by treating the carbon nanotube film with an organic solvent. Specifically, the carbon nanotube film is treated by applying the organic solvent to the carbon nanotube film to soak the entire surface of the carbon nanotube film. After being soaked by the organic solvent, the adjacent paralleled carbon nanotubes in the carbon nanotube film will bundle together, due to the surface tension of the organic solvent as the organic solvent volatilizes, and thus, the carbon nanotube film will shrink into an untwisted carbon nanotube wire.

The twisted carbon nanotube wire is formed by twisting a carbon nanotube film by using a mechanical force to turn the two ends of the carbon nanotube film in opposite directions. Referring to FIG. 6, the twisted carbon nanotube wire includes a plurality of carbon nanotubes oriented around an axial direction of the twisted carbon nanotube wire. The carbon nanotubes are aligned around the axis of the carbon nanotube twisted wire like a helix. More specifically, the twisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. The carbon nanotube segments can vary in width, thickness, uniformity and shape. The length of the carbon nanotube wire can be arbitrarily set as desired. A diameter of the twisted carbon nanotube wire is in an range from about 0.5 nm to about 100 nm.

Furthermore, the twisted carbon nanotube wire can be treated with a volatile organic solvent. After being soaked by the organic solvent, the adjacent paralleled carbon nanotubes in the twisted carbon nanotube wire will bundle together, due to the surface tension of the organic solvent as the organic solvent volatilizes. The specific surface area of the twisted carbon nanotube wire will decrease, and the density and strength of the twisted carbon nanotube wire will increase. Examples of the carbon nanotube wire are taught by U.S. Pat. No. 7,045,108 to Jiang et al., and US 20100173037 A1 to Jiang et al.

As discussed above, the carbon nanotube layer 104 can be used as a mask for growing the first semiconductor layer 106. The term 'mask' for growing the semiconductor layer 106 means that the carbon nanotube layer 104 can be used to shelter a part of the epitaxial growth surface 122 and expose the other part of the epitaxial growth surface 122. Thus, the semiconductor layer 106 can grow from the exposed epitaxial growth surface 122. The carbon nanotube layer 104 can form a pattern mask on the epitaxial growth surface 122 because the carbon nanotube layer 104 defines a plurality of first apertures 105. Compared to lithography or etching, the method of forming a carbon nanotube layer 104 as mask is simple, low in cost, and will not pollute the substrate 102.

In step S30, the first semiconductor layer 106, the active layer 108 and the second semiconductor layer 110 are grown in sequence by a molecular beam epitaxy, chemical beam epitaxy, vacuum epitaxy, low temperature epitaxy, selective epitaxy, liquid phase deposition epitaxy, metal organic vapor phase epitaxy, ultra-high vacuum chemical vapor deposition, hydride vapor phase epitaxy, and metal organic chemical vapor deposition.

A thickness of the first semiconductor layer 106 can be selected according to need. The thickness of the first semiconductor layer 106 can be in a range from about 1 nm to about 15 nm. In one embodiment, the thickness of the first semiconductor layer 106 is about 2 nm. The first semiconductor layer 106 includes an intrinsic semiconductor layer 101 and a doped semiconductor layer 111. The doped semiconductor layer 111 can be an N-type semiconductor layer or a P-type semiconductor layer. The N-type semiconductor layer provides electrons, and the P-type semiconductor layer provides cavities. The N-type semiconductor layer can be made of N-type gallium nitride, N-type gallium arsenide, or N-type copper phosphate. The P-type semiconductor layer can be made of P-type gallium nitride, P-type gallium arsenide, or P-type copper phosphate. In one embodiment, the doped semiconductor layer 111 is a Si-doped N-type gallium nitride semiconductor layer.

The active layer 108 is a photon exciting layer and can be one of a single quantum well layer or multilayer quantum well films. The active layer 108 can be made of gallium indium nitride (GaInN), aluminum indium gallium nitride (AlGaInN), gallium arsenide (GaSn), aluminum gallium arsenide (AlGaSn), gallium indium phosphide (GaInP), or aluminum gallium arsenide (GaInSn). The active layer 108, in which the cavities therein are filled by the electrons, can have a thickness of about 0.01 nm to about 0.6 nm. In one embodiment, the active layer 108 has a thickness of about 0.3 nm and includes a layer of InGaN/GaN.

The second semiconductor layer 110 can be an N-type semiconductor layer or a P-type semiconductor layer. The type of the second semiconductor layer 110 is different from the type of the first semiconductor layer 106. If the first semiconductor layer 106 is an N-type semiconductor, the second semiconductor layer 110 is a P-type semiconductor, and vice versa. A thickness of the second semiconductor layer 110 is in a range from about 0.1 nm to about 3 nm. A surface of the second semiconductor layer 110 away from the substrate 102 can act as a light-emitting face. In one embodiment, the second semiconductor layer 110 can be an Mg-doped P-type gallium nitride semiconductor layer and a thickness of the second semiconductor layer 110 is about 0.3 nm.

In one embodiment, the first semiconductor layer 106 is prepared by metal organic chemical vapor deposition method. The carrier gas includes $H_2$, $N_2$ or a mixture thereof. The trimethyl gallium is used as Ga source, the silane is used as the silicon source, and ammonia is used as a nitrogen source gas. The method for making the first semiconductor layer 106 includes the following steps:

S31, putting the substrate 102 with the carbon nanotube layer 104 thereon into a reaction chamber, flowing a carrier gas into the reaction chamber, and heating the reaction chamber to about 1100° C. to about 1200° C. for about 200 sec to about 1000 sec;

S32, growing a low-temperature GaN layer by cooling the reaction chamber to about 500° C. to about 650° C. and flowing trimethyl gallium and ammonia gas into the reaction chamber;

S33, stopping the flow of the trimethyl gallium, heating and maintaining the temperature of the reaction chamber at about 1100° C. to about 1200° C., and maintaining the temperature of the reaction chamber for about 30 seconds to about 300 seconds.

S34, maintaining the temperature of the reaction chamber in a range from about 1000° C. to about 1100° C. and the pressure in the reaction chamber at about 100 torr to about 300 torr; and S35, growing the doped semiconductor layers 111 by maintaining the temperature of the reaction chamber at about 1000° C. to about 1100° C., and flowing silane into the reaction chamber.

In step S31, the carrier gas includes $H_2$, $N_2$ or a mixture thereof. The substrate 102 can be sapphire.

In step S32, the trimethyl gallium can be substituted by the triethyl gallium. The low-temperature GaN layer is used as a buffer layer. A thickness of the low-temperature GaN layer is in a range from about 10 nm to about 50 nm. The low-temperature GaN layer can reduce the lattice mismatch between the first semiconductor layer 106 and the sapphire substrate 102. Therefore, the dislocation density of the first semiconductor layer 106 will be low. The material of the buffer layer can also be aluminium nitride.

In step S34, a high-temperature GaN layer is obtained. A thickness of the high-temperature GaN layer is in a range from about 200 nm to about 10 nm. The high-temperature GaN layer is used as an intrinsic semiconductor layer 101. The buffer layer, the intrinsic semiconductor layer 101 and the doped semiconductor layers 111 together are defined as the first semiconductor layer 106.

The growth process of the first semiconductor layer 106 can be divided into the following stages:

nucleating on the epitaxial growth surface 122 and growing a plurality of epitaxial crystal grains along the direction substantially perpendicular to the epitaxial growth surface 122.

forming a continuous epitaxial film by growing the epitaxial crystal grains along the direction substantially parallel to the epitaxial growth surface 122.

forming a high-grade epitaxial film by growing the epitaxial film along a direction substantially perpendicular to the epitaxial growth surface 122.

In the first stage, the epitaxial crystal grains grow from the exposed part of the epitaxial growth surface 122 and through the aperture 105. The growth of the epitaxial crystal grains along the direction substantially perpendicular to the epitaxial growth surface 122 is called vertical epitaxial growth.

In the second stage, the epitaxial crystal grains are joined together to form an integral structure to cover the carbon nanotube layer 104. The epitaxial crystal grains grow to enclose the carbon nanotubes of the carbon nanotube layer 104 and form a plurality of grooves on the bottom surface of the first semiconductor layer 106. The grooves are covered by the substrate 102 to form a plurality of channels 103. The inner wall of the channels 103 can be in contact with the carbon nanotubes or spaced from the carbon nanotubes, which depends on whether the material of the epitaxial film and the carbon nanotubes have mutual infiltration. Thus, the epitaxial film defines a patterned depression on the surface oriented to the epitaxial growth surface 122. The patterned depression corresponds to the patterned carbon nanotube layer 104. If the carbon nanotube layer 104 includes a layer of parallel and spaced carbon nanotube wires, the patterned depression is a plurality of parallel and spaced grooves. If the first carbon nanotube layer 104 includes a plurality of carbon nanotube wires crossed or weaved together to form a carbon nanotube net, the patterned depression is a grooves network including a plurality of cross-set grooves. The cross section of the channel 103 can be geometrically shaped. The biggest diameter of the channel 103 is in a range from about 20 nm to about 200 nm. In one embodiment, the biggest diameter of the channel 103 is in a range from about 50 nm to about 100 nm. The carbon nanotube layer 104 can prevent the lattice dislocation between the epitaxial crystal grains and the substrate 102 from growing. The growth of epitaxial crystal grains along the direction substantially parallel to the epitaxial growth surface 122 is called lateral epitaxial growth.

In the third stage: the first semiconductor layer 106 is obtained. The epitaxial crystal grains, the epitaxial film and the high-grade epitaxial film constitute the first semiconductor layer 106. Because the carbon nanotube layer 104 can prevent the lattice dislocation between the epitaxial crystal grains and the substrate 102 from growing in step (302), the first semiconductor layer 106 has less defects therein.

A method for growing the active layer 108 is similar to the method for growing the first semiconductor layer 106. The active layer 108 is grown after growing the first semiconductor layer 106. In one embodiment, the method for growing the active layer 108 includes the following steps:

step a1, stopping the flow of the silane into the reaction chamber after the step S35 of growing the first semiconductor layer 106, heating the reaction chamber to a temperature of about 700° C. to about 900° C., and maintaining the pressure of the reaction chamber at about 50 torr to about 500 torr.

step a2, growing InGaN/GaN multi-quantum well layer to form the active layer 108 by flowing trimethyl indium into the reaction chamber.

A method for growing the second semiconductor layer 110 is similar to the method for growing the first semiconductor layer 106. The second semiconductor layer 110 is grown after growing the active layer 108. In one embodiment, the method for growing the second semiconductor layer 110 includes the following steps:

step b1, stopping the flow of the trimethyl indium into the reaction chamber after the step a2 of growing the active layer 108, heating the reaction chamber to a temperature of about 1000° C. to about 1100° C., and maintaining pressure of the reaction chamber at about 76 torr to about 200 torr; and step b2, growing Mg-doped P-type GaN layer to form the second semiconductor layer 110 by flowing ferrocene magnesium into the reaction chamber.

Figure 7:
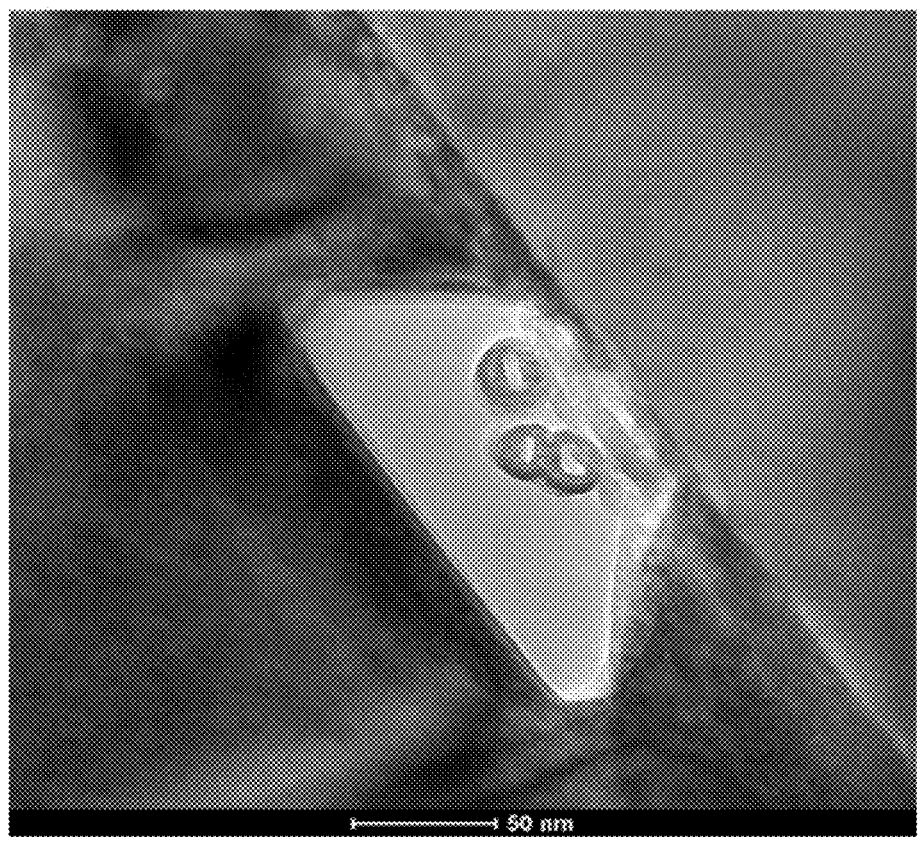
FIG. 7 is a transmission electron microscopy (TEM) of a cross-sectional view of the first semiconductor layer and the substrate of the LED made by the method of FIG. 1.

After the second semiconductor layer 110 is obtained, a cross section between the substrate 102 and the first semiconductor layer 106 is observed and tested by a TEM. Referring to FIG. 7, a light-colored portion in the TEM picture is the sapphire substrate 102, and a dark-colored portion in the TEM picture is the first semiconductor layer 106. The first semiconductor layer 106 only grows from a portion surface of the epitaxial growth surface 122 exposed by the aperture 105 of the carbon nanotube layer 104. A number of channels are defined between the substrate 102 and the first semiconductor layer 106. The carbon nanotubes are located in the channels and spaced from the first semiconductor layer 106.

Furthermore, a highly doped semiconductor electrode contact layer can be located on a top surface of the second semiconductor layer 110. The highly doped semiconductor electrode contact layer can be obtained by a method similar to the method for making the second semiconductor layer 110, and the only difference is to change the content of doping elements in the source gas during the growing progress.

In step S40, the second semiconductor layer 110, and the active layer 108 are etched by a reactive ion etching. After the active layer 108 is etched, the first semiconductor layer 106 can also be etched by the reactive ion etching. After the first semiconductor layer 106 is etched, the carbon nanotube layer 104 is covered by the semiconductor layer 106. The substrate 102, the carbon nanotube layer 104, the first semiconductor layer 106, the active layer 108 and the second semiconductor layer 110 constitute an LED chip.

In one embodiment, the active layer 108 is made of InGaN/GaN layer and the second semiconductor layer 110 is made of P-type GaN layer. The second semiconductor layer 110 and the active layer 108 can be etched by placing the LED chip into an inductively coupled plasma device and adding a mixture of silicon tetrachloride and chlorine into the inductively coupled plasma device. In one embodiment, the power of the inductively coupled plasma device is about 50 W, the speed of the chlorine is about 26 sccm, and the speed of the silicon tetrachloride is about 4 sccm. The partial pressure of the silicon tetrachloride and chlorine is about 2 Pa. The etched thickness of the second semiconductor layer 110 is about 0.3 nm. The etched thickness of the active layer 108 is about 0.3 nm.

In step S50, the first electrode 114 is located on the exposed surface of the first semiconductor layer 106, and the second electrode 112 is located on a top surface of the second semiconductor layer 110. The first electrode 114 may be a P-type or an N-type electrode and is the same type as the first semiconductor layer 106. The second electrode 112 may be a P-type or an N-type electrode and is the same type as the second semiconductor layer 110.

A thickness of the first electrode 114 can range from about 0.01 nm to about 2 nm. A thickness of the second electrode 112 can range from about 0.01 nm to about 2 nm. The first electrode 114 can be made of titanium, aluminum, nickel, gold, or a combination thereof. In one embodiment, the first electrode 114 is an N-type electrode and includes a nickel layer and a gold layer. A thickness of the nickel layer is about 150 angstroms (Å). A thickness of the gold layer is about 1000 Å. In one embodiment, the second electrode 112 is a P-type electrode and includes a titanium layer and a gold layer. A thickness of the titanium layer is about 150 Å. A thickness of the gold layer is about 2000 Å. After the step S50, an LED preform is obtained.

In step S60, the carbon nanotube layer 104 can be removed by a plasma etching method, a laser heating method, or a furnace heating method. The carbon nanotubes in the carbon nanotube layer 104 will be oxidized and removed.

In one embodiment, the plasma etching method for removing the carbon nanotube layer 104 includes the following steps:

S612, placing the LED preform into a vacuum chamber; and

S614, flowing reactive gases into the vacuum chamber to obtain plasmas of the reactive gases to etch the carbon nanotube layer 104.

In step S612, the vacuum chamber can be a vacuum chamber of a reactive ion etching machine.

The step S614 can include the following substeps:

S6142, pumping the vacuum chamber of the reactive ion etching machine into a vacuum;

S6144, flowing the reactive gases into the vacuum chamber; and

S6146, producing the plasmas of the reactive gases by glow discharge method.

In step S6144, the reactive gases can be oxygen gas, hydrogen, or tetrafluoromethane.

In step S6146, the plasmas include charged ions and electrons. The plasmas can be oxygen plasmas, hydrogen plasmas or tetrafluoromethane plasmas. The plasmas can be selected according to need. In one embodiment, the reactive gas is oxygen gas and the plasmas are oxygen plasmas. Since the plasmas have a better mobility and the carbon nanotubes in the channels 103 are spaced apart from the first semiconductor 106, the plasmas can flow into the channels 103 of the LED preform by controlling the flow time and pressure of the plasmas. The plasmas collide with the carbon nanotubes in the channels 103 to physically etch and remove the carbon nanotubes. The plasmas and the carbon nanotubes may have an oxidation reaction, and carbon dioxide or other volatile reaction products will be produced. The plasmas and the carbon nanotubes need sufficient reaction time to remove the carbon nanotubes. A power of the glow discharge is in a range from about 20 watts (W) to about 300 W. In one embodiment, the power of the glow discharge is about 150 W. A flow rate of the reaction gas is in a range from about 10 ml/sccm to about 100 ml/sccm. In one embodiment, the flow rate of the reaction gas is about 10 ml/sccm. A pressure of the vacuum chamber is in a range from about 1 Pa to about 100 Pa. A reaction time is in a range from about 10 sec to about 1 hour. In one embodiment, the reaction time is in a range from about 15 sec to about 15 minutes.

In one embodiment, the laser heating method for removing the carbon nanotube layer 104 includes the following steps:

S622, providing a laser generator which can generate a laser beam to irradiate the bottom surface of the substrate 102 of the LED preform;

S624, scanning the bottom surface of the substrate 102 of the LED preform by making a relative movement between the laser and the substrate 102 in an environment containing oxygen gas.

In step S622, the laser is perpendicular to the exposed bottom surface of the substrate 102 away from the carbon nanotube layer 104. The laser generator can be a solid laser generator, liquid laser generator, gas laser generator, and semiconductor laser generator. A power density of the laser is larger than $0.053 \times 10^{12}$ W/m$^2$. As the laser irradiates the surface of the substrate 102, a laser beam produced by the laser generator is focused on the surface of substrate 102 and forms a laser irradiating area, e.g., a circle area, on the substrate 102 in which a diameter of the laser irradiating area can range from about 1 mm to about 5 mm. As a plurality of laser generators works together to produce a strip laser irradiating area, a width of the strip laser irradiating area is in a range from about 1 mm to about 5 mm. An irradiating time of the laser is shorter than 1.8 sec. In one embodiment, the laser generator is a carbon dioxide laser generator, a power of the carbon dioxide laser generator is about 30 watts, a wavelength of the laser is about 10.6 nm, and a diameter of the laser irradiating area is about 3 mm.

The first semiconductor layer 106 should be stable under the irradiation of the laser. If the first semiconductor layer 106 includes the low-temperature GaN layer, the wavelength of the laser cannot be about 248 nm because the low-temperature GaN layer will decompose under the irradiation of the laser at a wavelength of about 248 nm.

The step S624 can be executed by two methods. The first method is executed by fixing the LED preform and moving a mobile laser generator to irradiate the LED preform. The second method is executed by fixing the laser generator and moving a mobile LED preform to make the LED preform be irradiated by the laser generator. A moving direction of the laser beam relative to the substrate can be substnatially perpendicular or parallel to the axial direction of the carbon nanotubes in the carbon nanotube layer 104.

If the substrate 102 is opaque and the substrate 102 is irradiated by the laser, the substrate 102 is heated by the laser. The heat is conducted to the carbon nanotube layer 104 via the substrate 102 to heat the carbon nanotube layer 104. The oxygen gas can flow into the channels 103 easily because the carbon nanotubes are spaced from the first semiconductor layer 106, thus, the carbon nanotubes absorb the heat and react with the oxygen gas, and the carbon nanotube layer 104 will be oxidized into carbon dioxide gas and removed.

If the substrate 102 is transparent, the laser can pass through the substrate 102 and irradiate the carbon nanotubes directly. The carbon nanotubes can absorb the energy of the laser and be heated by the laser, so that the carbon nanotubes can react with the oxygen gas and be removed. The reaction time can be controlled by adjusting the relative moving speed between the laser generator and the LED preform. If the power density and the wavelength of the laser are fixed, the slower the moving speed of the laser generator or the LED preform, and the longer the irradiation time of the carbon nanotubes. The longer the irradiation time of the carbon nanotubes, the more energy the carbon nanotubes absorb. The more energy that the carbon nanotubes absorb, the easier the carbon nanotubes oxidize. In one embodiment, the relative moving speed of the laser generator and the carbon nanotube layer 104 is less than 10 mm/sec.

In one embodiment, the furnace heating method for removing the carbon nanotube layer 104 include the following steps:

S632: providing a heating furnace having a chamber and placing the LED preform into the chamber;

S634: flowing oxygen gas into the chamber and heating the LED preform.

In step S632, the structure of the furnace is not limited. In one embodiment, the furnace is a resistance furnace.

In step S634, the carbon nanotubes in the carbon nanotube layer 104 can absorb the heat in the heating furnace and be oxidized by the oxygen gas. The heating temperature of the heating furnace is higher than 600° C. to ensure that the carbon nanotubes can absorb enough heat and be oxidized. In one embodiment, the temperature of the heating furnace is heated to about 650° C. to remove the carbon nanotubes. After the carbon nanotubes are removed, the LED 10 is obtained.

In each of the plasma etching method, the laser heating method and the furnace heating method is simple and creates no pollution.

The method for making LED 10 has the following merits that:

First, the method is simple and low-cost because the carbon nanotube layer 104 acts as a mask to form a number of channels 103 between the first semiconductor layer 106 and the substrate 102 without stripping the substrate 102. Second, the carbon nanotube layer 104 is a free-standing structure, therefore, the carbon nanotube layer 104 can be directly located on the substrate 102.

Figure 8:
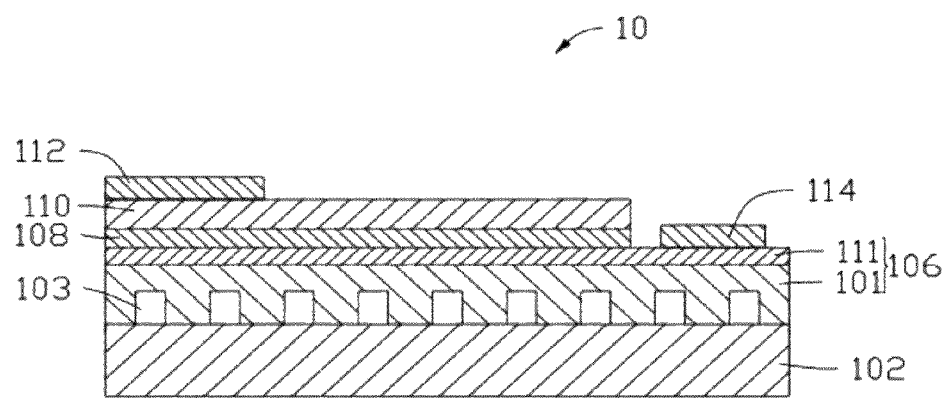
FIG. 8 is a schematic structural view of an LED made by the method of FIG. 1.

Referring to FIG. 8, one embodiment of an LED 10 is provided. The LED 10 includes a substrate 102, a intrinsic semiconductor layer 101, a doped semiconductor layer 111, an active layer 108, a second semiconductor layer 110, a first electrode 114 and a second electrode 112. The intrinsic semiconductor layer 101, the doped semiconductor layer 111, the active layer 108 and the second semiconductor layer 110 are located on the substrate 102 in that order. The intrinsic semiconductor layer 101 and the doped semiconductor layer 111 are a first semiconductor layer 106. The first semiconductor layer 106 is located on the substrate 102. The first electrode 114 is electrically connected with the first semiconductor layer 106. The second electrode 112 is electrically connected with the second semiconductor layer 110. A number of grooves are defined on a bottom surface of the first semiconductor layer 106 contacting with the substrate 102. The grooves are covered by the substrate 102 to form a number of channels 103. The channels 103 are between the first semiconductor layer 106 and substrate 102. The first semiconductor layer 106 contacts a portion surface of the substrate 102 to define a number of channels 103.

The cross section of the channels 103 can be geometrically shaped. A diameter of the channels 103 can be in a range from about 20 nm to about 200 nm. In one embodiment, the diameter of the channels 103 can be in a range from about 50 nm to about 100 nm. If the carbon nanotube layer 104 includes a number of carbon nanotubes and axial directions of the carbon nanotubes is oriented along one direction, the grooves are a plurality of strip grooves paralleled to and spaced from each other, and the channels 103 are a plurality of strip channels 103 paralleled to and spaced from each other. If the carbon nanotube layer 104 includes a number of carbon nanotube wires parallel to and spaced from each other, the channels 103 are a plurality of strip channels paralleled to and spaced from each other. If the carbon nanotube layer 104 is composed of carbon nanotube wires crossed with each other or woven together to form a network structure or the carbon nanotube layer 104 is composed of a number of cross-stacked carbon nanotube film, the grooves are crossed with each other or woven together form a groove network. If the carbon nanotube layer 104 is composed of a number of cross-stacked carbon nanotube films, an angle defined between the carbon nanotubes in two adjacent carbon nanotube films is greater than 0 degrees and less than 90 degrees. The grooves are composed of a plurality first paralleled grooves crossed with a plurality of second paralleled grooves substantially perpendicular to the first grooves. The grooves are crossed with each other to form a groove network. The grooves are covered by the substrate 102 to form a number of channels 103 between the first semiconductor layer 106 and the substrate 102. The channels 103 are interconnected. The channels 103 form a channel network. The channels 103 can scatter light from the active layer 108 and improve the extraction efficiency of the LED 10.

Figure 9:
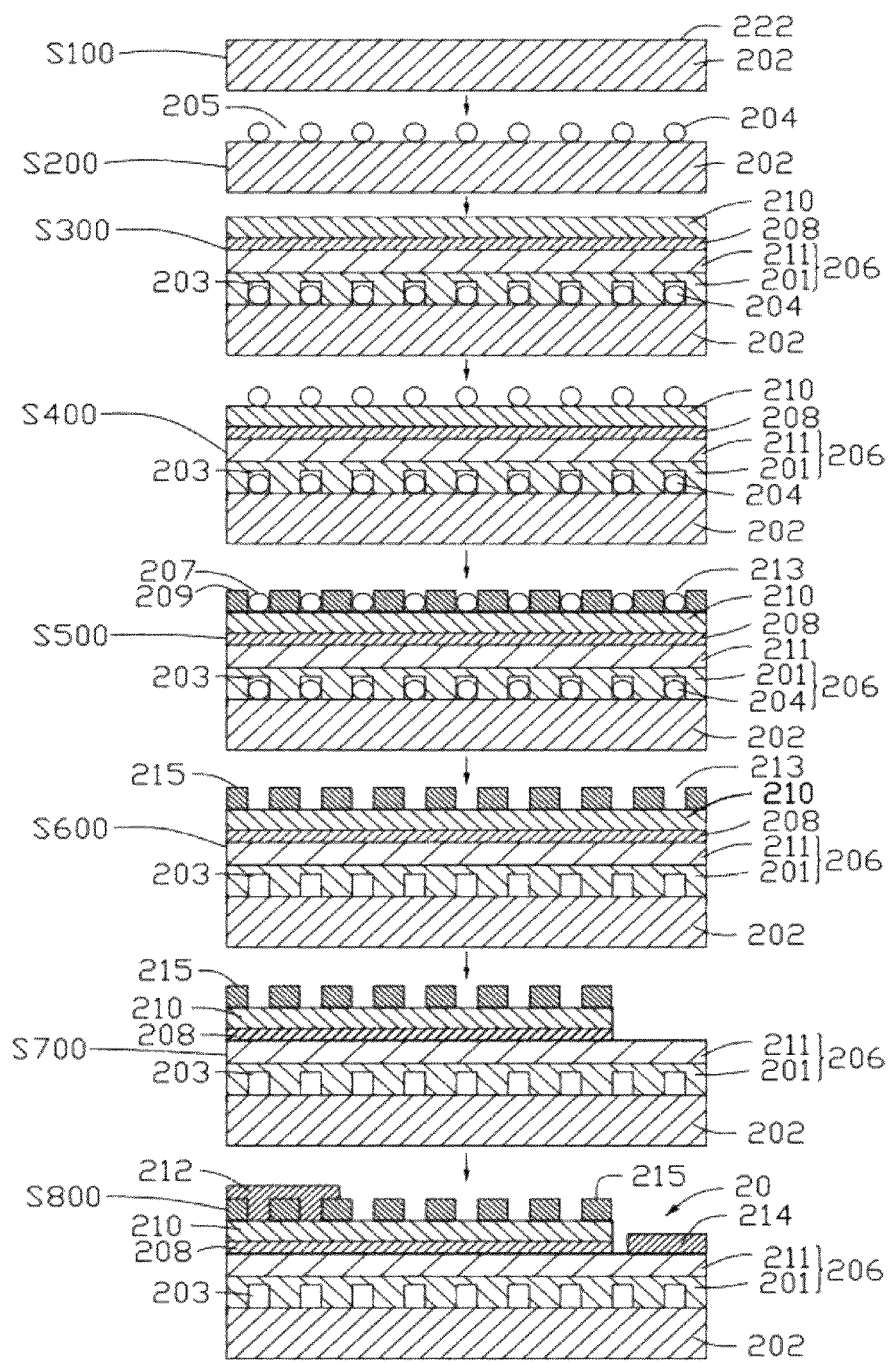
FIG. 9 is a flowchart of one embodiment of a method for making an LED.

Referring to FIG. 9, a method for making an LED 20 of one embodiment includes the following steps of:

S100: providing a substrate 202 having an epitaxial growth surface 222;

S200: placing a first carbon nanotube layer 204 on the epitaxial growth surface 222;

S300: growing a first semiconductor layer 206, an active layer 208 and a second semiconductor layer 210 on the epitaxial growth surface 222 successively;

S400: placing a second carbon nanotube layer 207 on the second semiconductor layer 210;

S500: growing a third semiconductor layer 209 on a surface of the second semiconductor layer 210 away from the substrate 202, wherein the third semiconductor layer 209 includes a number of protrusions spaced from each other;

S600: removing the first carbon nanotube layer 204 and the second carbon nanotube layer 207;

S700: exposing a surface of the first semiconductor layer 206 by etching the third semiconductor layer 209, the second semiconductor layer 210 and the active layer 208; and S800: preparing a first electrode 214 on the exposed surface of the first semiconductor layer 206, and preparing a second electrode 212 on the second semiconductor layer 210.

The method for making the LED 20 in FIG. 9 is similar to the method for making the LED 10 in FIG. 1. The steps S100, S200, and S300 of the method for making the LED 20 are identical to the steps S10, S20, and S30 of the method for making the LED 10, except that a third semiconductor layer 209 is formed on the second semiconductor layer 210.

In step S400, the second carbon nanotube layer 207 is a mask during the growth process of the third semiconductor layer 209. The second carbon nanotube layer 207 is identical with the first carbon nanotube layer 104 in FIG. 1. The third semiconductor layer 209 grows from the second semiconductor layer 210 corresponding to the apertures 205 of the second carbon nanotube layer 207. After step S400, an LED chip is obtained.

In step S500, a number of third semiconductor particles nucleate and epitaxially grow on a top surface of the second semiconductor layer 210 away from the substrate 202. The third semiconductor particles grow from the apertures 205 of the second carbon nanotube layer 207 along a direction substantially perpendicular to the top surface of the second semiconductor layer 210. The third semiconductor particles are a number of protrusions 215 spaced by the second carbon nanotube layer 207. The protrusions 215 constitute the third semiconductor layer 209. The third semiconductor layer 209 is discontinuous and spaced from each other to form a number of openings 213 defined by the third semiconductor layer 209. The carbon nanotubes in the second carbon nanotube layer 207 are located in the openings 213. The third semiconductor layer 209 can be a number of substantially paralleled strip protrusions 215 or an protrusions array. A thickness of the third semiconductor layer 209 can be controlled by adjusting the growth time of the third semiconductor particles. The material of the third semiconductor layer 209 can be gallium nitride, gallium arsenide, and copper phosphide. The material of the third semiconductor layer 209 is the same as the second semiconductor layer 210. In one embodiment, the material of the third semiconductor layer 209 is Mg-doped GaN.

In one embodiment, the step S500 includes the following substeps:

placing the LED chip obtained after the step S400 into a chamber, heating the chamber to a temperature between about 1100° C. to about 1200° C., flowing a mixture gas of $H_2$ and $N_2$ as carrier gas, and heating the chamber for about 200 sec to about 1000 sec to purify the LED chip.

maintaining the temperature of the chamber at about 1000° C. to about 1100° C. and the pressure of the chamber at about 76 torr to about 200 torr, and flowing trimethyl gallium, and ferrocene magnesium to grow Mg-doped P-type GaN layer. The Mg-doped P-type GaN layer constitutes the third semiconductor layer 209. A thickness of the third semiconductor layer 209 is in a range from about 10 nm to about 50 nm.

In step S600, the first carbon nanotube layer 204 and the second carbon nanotube layer 207 are removed by the same method as the step S60 of the method for making the LED 10 of FIG. 1. The first carbon nanotube layer 204 and the second carbon nanotube layer 207 can be removed by methods such as plasma etching, laser heating, or furnace heating. After the first carbon nanotube layer 104 is removed, a number of nano-scale grooves are defined on a bottom surface of the first semiconductor layer 206 oriented to the substrate 202. The grooves are covered by the substrate 202 to form a number of channels 203. After the second carbon nanotube layer 207 is removed, a number of protrusions 215 are obtained and constitute the third semiconductor layer 209. The third semiconductor layer 209 is a nano-scale microstructure formed on a top surface of the second semiconductor layer 210.

In one embodiment, in step S600, the second carbon nanotube layer 207 is not removed and the protrusions 215 of the third semiconductor layer 209 can be spaced by the second carbon nanotube layer 207. The second carbon nanotube layer 207 is transparent and can be electrically connected to the second electrode 212.

The step S700 is similar to the step S40 of the method for making the LED 10 shown in FIG. 1. The difference is that the third semiconductor layer 209 is etched with the second semiconductor layer 210 and the active layer 208 together. The third semiconductor layer 209 can be etched by reactive ion etching method.

The step S800 is similar to the step S50 of the method for making the LED 10 shown in FIG. 1. The difference is that the second electrode 212 covers a portion of the third semiconductor layer 209 located below the second electrode 212. The third semiconductor layer 209 includes a number of protrusions. The protrusions are spaced from each other to define a number of openings 213 in the third semiconductor layer 209. The second electrode 212 penetrates the openings 213 and contacts with the second semiconductor layer 210. After the second electrode 212 is obtained, a portion of the third semiconductor layer 209 is located between the second electrode 212 and the second semiconductor layer 210.

The method for making the LED 20 includes the following merits. First, the second carbon nanotube layer 207 is a mask to grow the third semiconductor layer 209, therefore the method is simple and low in cost compared to traditional nano-imprint technology. Second, the second carbon nanotube layer 207 is a free-standing structure and can be located on the top surface of the second semiconductor layer 210, therefore, the method is simple and is adapted to large-scale industrial manufacturing.

Figure 10:
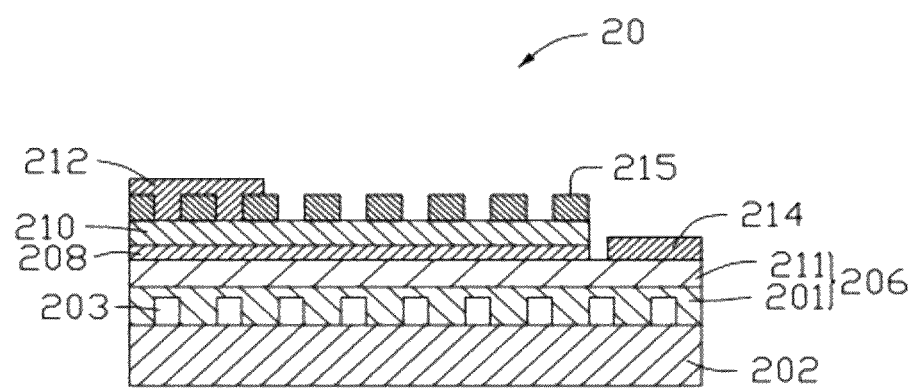
FIG. 10 is a schematic structural view of an LED made by the method of FIG. 9.

Referring to FIG. 10, an LED 20 of one embodiment is illustrated. The LED 20 includes a substrate 202, a first semiconductor layer 206, an active layer 208, a second semiconductor layer 210, a third semiconductor layer 209, and a first electrode 214 and a second electrode 212. The first semiconductor layer 206 includes a buffer layer (not shown in FIG. 10), an intrinsic semiconductor layer 201 and a doped semiconductor layer 211. The buffer layer, the intrinsic semiconductor layer 201, the doped semiconductor layer 211, the active layer 208, and the second semiconductor layer 210 are located on one side of the substrate 202 in that order. The first semiconductor layer 206 is located oriented to the substrate 202. The first electrode 214 is electrically connected to the first semiconductor layer 206. The second electrode 212 is electrically connected to the second semiconductor layer 210. A number of nano-scale grooves are defined on a bottom surface of the first semiconductor layer 206 contacting the substrate 202. The grooves are covered by the substrate 202 to form a number of channels 203 between the substrate 202 and the first semiconductor layer 210. A third semiconductor layer 209 is located on a top surface of the second semiconductor layer 210 away from the substrate 202.

The structure of the LED 20 is similar to the structure of the LED 10. The difference is that the third semiconductor layer 209 is located on the top surface of the second semiconductor layer 210 away from the substrate 202. The third semiconductor layer 209 includes a number of protrusions spaced from each other. The cross section of the protrusions can have irregular geometric shapes. In one embodiment, the third semiconductor layer 209 includes a number of strip protrusions parallel to and spaced from each other. The extending directions of the strip protrusions can the same as or different from the extending direction of the strip channels 203. In one embodiment, the extending direction of the strip protrusions is substantially perpendicular to the extending direction of the strip channels 203. The strip protrusions are spaced from each other by the strip openings 213. A width of the strip protrusions is in a range from about 10 nm to about 10 nm. In one embodiment, the width of the strip protrusions is in a range from about 50 nm to about 100 nm. A width of the strip openings 213 is in a range from about 20 nm to about 200 nm. The third semiconductor layer 209 includes a number of dot-like protrusions in one embodiment. The dot-like protrusions are arranged in an array. The protrusions are spaced from each other to form a number of openings. The second electrode 212 penetrates the openings and contacts the second semiconductor layer 210.

The light extraction rate of the LED 20 is improved because the third semiconductor layer 209 has a number of nano-scale protrusions 215. Therefore, the directions of the large-angle lights are changed and exit from the LED 20 if the large-angle lights produced in the active layer 208 transmit to the third semiconductor layer 209.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A light emitting diode comprising:
   a substrate;
   a first semiconductor layer stacked on the substrate directly;
   an active layer stacked on the first semiconductor layer;
   a second semiconductor layer stacked on the active layer;
   a first electrode electrically connected to the first semiconductor layer; and
   a second electrode electrically connected to the second semiconductor layer; and
   a plurality of channels defined between the first semiconductor layer and the substrate;
   wherein a plurality of grooves defined in a surface of the first semiconductor layer are adjacent to the substrate, the grooves are covered by the substrate to form the channels.

2. The light emitting diode of claim 1, wherein the grooves are a plurality of strip shaped grooves substantially parallel to and spaced from each other, the grooves are covered by the substrate to form the channels.

3. The light emitting diode as claim 1, wherein the grooves are interconnected, the grooves are covered by the substrate to form the channels.

4. The light emitting diode as claim 3, wherein the channels are crossed with each other to form a channel network.

5. The light emitting diode as claim 4, wherein the channels are interconnected.

6. The light emitting diode as claim 1, wherein a diameter of each of the channels is in a range from about 20 nm to about 200 nm.

7. The light emitting diode as claim 6, wherein the diameter of the each of channels is in a range from about 50 nm to about 100 nm.

8. The light emitting diode as claim 1, further comprising a third semiconductor layer located on a surface of the second semiconductor layer.

9. The light emitting diode as claim 8, wherein the third semiconductor layer comprises a body and a plurality of protrusions disposed on the body and spaced from each other.

10. The light emitting diode as claim 9, wherein the third semiconductor layer comprises a body and a plurality of strip protrusions disposed on the body and substantially parallel to and spaced from each other.

11. The light emitting diode as claim 9, wherein the third semiconductor layer comprises a body and a plurality of dot-shaped protrusions disposed on the body and spaced from each other.

12. The light emitting diode as claim 11, wherein the dot-shaped protrusions are arranged in an array.

13. The light emitting diode as claim 12, wherein the protrusions are spaced from each other to define a number of openings and a portion of the second semiconductor layer is exposed from the openings.

14. The light emitting diode as claim 13, wherein the second electrode penetrates the openings defined by the third semiconductor layer and contacts the second semiconductor layer.

15. A light emitting diode comprising:
    a substrate;
    a first semiconductor layer stacked on the substrate;
    an active layer stacked on the first semiconductor layer;
    a second semiconductor layer stacked on the active layer;
    a first electrode electrically connected to the first semiconductor layer;
    a second electrode electrically connected to the second semiconductor layer; and
    a plurality of grooves defined in a surface of the first semiconductor layer are adjacent to the substrate, wherein the grooves are covered by the substrate.

16. A light emitting diode comprising:
    a substrate;
    a first semiconductor layer stacked on the substrate;
    an active layer stacked on the first semiconductor layer;
    a second semiconductor layer stacked on the active layer;
    a third semiconductor layer located on a surface of the second semiconductor layer;
    a first electrode electrically connected to the first semiconductor layer; and
    a second electrode electrically connected to the second semiconductor layer;
    wherein a plurality of channels defined between the first semiconductor layer and the substrate;
    wherein the third semiconductor layer comprises a body and a plurality of dot-shaped protrusions disposed on the body and spaced from each other.

17. The light emitting diode as claim 16, wherein the dot-shaped protrusions are arranged in an array.

18. The light emitting diode as claim 17, wherein the protrusions are spaced from each other to define a number of openings and a portion of the second semiconductor layer is exposed from the openings.

19. The light emitting diode as claim 18, wherein the second electrode penetrates the openings defined by the third semiconductor layer and contacts the second semiconductor layer.

* * * * *